(12) United States Patent
Hiraizumi (10) Patent No.: US 7,005,706 B2
(45) Date of Patent: Feb. 28, 2006

(54) SEMICONDUCTOR DEVICE HAVING FULLY AND PARTIALLY DEPLETED SOI ELEMENTS ON A SUBSTRATE

(75) Inventor: Marie Hiraizumi, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 102 days.

(21) Appl. No.: 10/687,967

(22) Filed: Oct. 20, 2003

(65) Prior Publication Data
US 2004/0104432 A1 Jun. 3, 2004

(30) Foreign Application Priority Data
Oct. 25, 2002 (JP) ............................. 2002-310494

(51) Int. Cl.
*H01L 27/01* (2006.01)
*H01L 27/12* (2006.01)
*H01L 31/0392* (2006.01)

(52) U.S. Cl. ...................... 257/348; 257/347; 257/350; 257/351

(58) Field of Classification Search ................ 357/348, 357/350, 351, 347
See application file for complete search history.

(56) References Cited

U.S. PATENT DOCUMENTS

| | | | | |
|---|---|---|---|---|
| 6,222,234 B1 * | 4/2001 | Imai | ........................... | 257/347 |
| 6,368,938 B1 * | 4/2002 | Usenko | ..................... | 438/407 |
| 6,461,907 B1 * | 10/2002 | Imai | ........................... | 438/217 |
| 6,537,891 B1 * | 3/2003 | Dennison et al. | .......... | 438/406 |
| 6,724,045 B1 * | 4/2004 | Ushiku | ....................... | 257/347 |
| 6,914,295 B1 * | 7/2005 | Chau et al. | ................. | 257/333 |
| 2003/0227056 A1 * | 12/2003 | Wang et al. | ............... | 257/347 |

FOREIGN PATENT DOCUMENTS

JP 09-135030 5/1997
JP 11-298001 10/1999

* cited by examiner

*Primary Examiner*—Nathan J. Flynn
*Assistant Examiner*—Victor A. Mandala, Jr.
(74) *Attorney, Agent, or Firm*—Volentine Francos & Whitt, PLLC (57) ABSTRACT

A semiconductor device includes a silicon layer on an insulating layer. The silicon layer has a first area and a second area. An FD-MOSFET is formed in the first area and a PD-MOSFET is formed in the second area. The semiconductor device satisfies the following formulas: the thickness of the silicon layer is 28 nm to 42 nm, the impurity concentration Df cm$^{-3}$ of the first area is $Df \leq 9.29*10^{15}*(62.46-ts)$ and $Df \leq 2.64*10^{15}*(128.35-ts)$, and the impurity concentration Dp of the second area is $Dp \leq 9.29*10^{15}*(62.46-ts)$ and $Dp \leq 2.64*10^{15}*(129.78-ts)$.

18 Claims, 9 Drawing Sheets

SEMICONDUCTOR DEVICE HAVING FULLY AND PARTIALLY DEPLETED SOI ELEMENTS ON A SUBSTRATE

CROSS REFERENCE TO RELATED APPLICATION

A claim of priority under 35 U.S.C. §119 is made to Japanese patent application No. 2002-310494, filed Oct. 25, 2002, which is herein incorporated by reference in their entirety for all purposes.

BACKGROUND OF THE INVENTION

1. Field of the Invention

The present invention relates to a semiconductor device which includes a FD(fully-depleted) MOSFET(Metal Oxide Semiconductor Field Effect Transistor) and a PD(partially-depleted) MOSFET in a common SOI(Silicon On Insulator) substrate.

2. Description of the Related Art

A semiconductor device that has a FD-MOSFET and a PD-MOSFET formed in the common SOI layer is described in the following references.

Japanese Patent Publication Laid-Open No. Hei 9(1997)-135030

Japanese Patent Publication Laid-Open No. Hei 11(1999)-298001

The references describe an SOI device that has a FD-MOSFET and a PD-MOSFET in the common silicon layer formed in the SOI substrate.

However, in order to shrink a size of elements formed in the silicon layer, the silicon layer becomes thin. Therefore, a variation of the thickness of the silicon layer at a channel region of the MOSFET is increased. Further, a variation of an electrical characteristic of the MOSFET formed in the silicon layer is increased.

(1) A SOI substrate has a variation of thickness that is formed during a manufacturing process.

(2) A magnitude of the variation of the silicon layer does not depend on a total thickness of the silicon layer. When the silicon layer becomes thin, the ratio of the magnitude of the variation increases. For example, an average of the thickness of the silicon layer is 100 nm and the variation of the silicon layer is ±2 nm, the ratio of the magnitude of the variation is ±2/100=±0.02. If an average of the thickness of the silicon layer is 50 nm, the variation of the silicon layer is ±2 nm. That is, the ratio of the magnitude of the variation increases ±2/50=±0.04.

(3) When the MOSFET is formed in the silicon layer of the SOI substrate, an electrical characteristic of the MOSFET is related to the thickness of the silicon layer. That is, when the silicon layer becomes thin, the variation of the electrical characteristic of the MOSFET is increased

SUMMARY OF THE INVENTION

According to one aspect of the present invention, there is provided a semiconductor device that includes a silicon layer on an insulating layer. The silicon layer has a first area and a second area. An FD-MOSFET is formed in the first area and a PD-MOSFET formed in the second area. The semiconductor device of the present invention is satisfied the following formulas; a thickness of the silicon layer is 28 nm to 42 nm, an impurity concentration Df cm$^{-3}$ of the first area is Df$\leq$9.29*10$^{15}$ *(62.46–ts) and Df$\leq$2.64*10$^{15}$* (128.35–ts), an impurity concentration Dp of the second area is Dp$\leq$9.29*10$^{15}$*(62.46–ts) and Dp$\leq$2.64*10$^{15}$* (129.78–ts).

DETAILED DESCRIPTION OF THE PREFERRED EMBODIMENTS

A semiconductor device according to preferred embodiments of the present invention will be explained hereinafter with reference to the accompanying figures. In order to simplify explanation, the same elements are given the same or corresponding reference numerals.

First Preferred Embodiment

Figure 1:
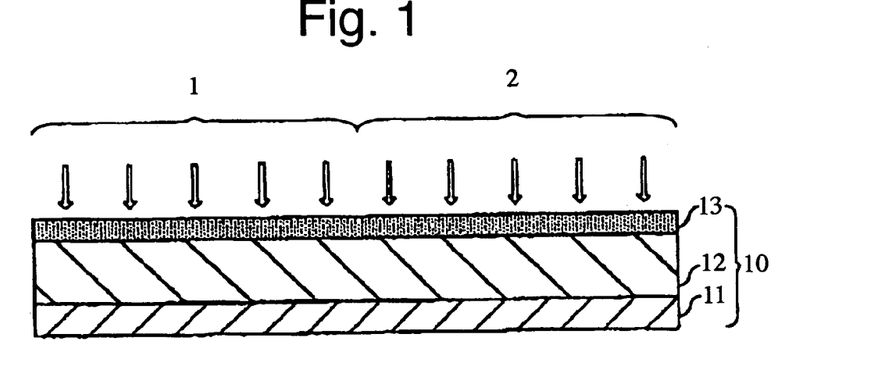
FIG. 1 is a cross-sectional view showing a first step of the present invention.
Figure 2:
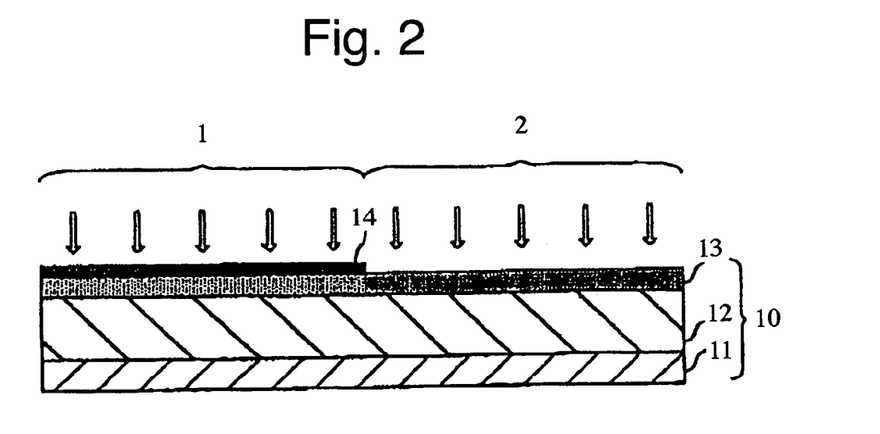
FIG. 2 is a cross-sectional view of a second step of the present invention.
Figure 3:
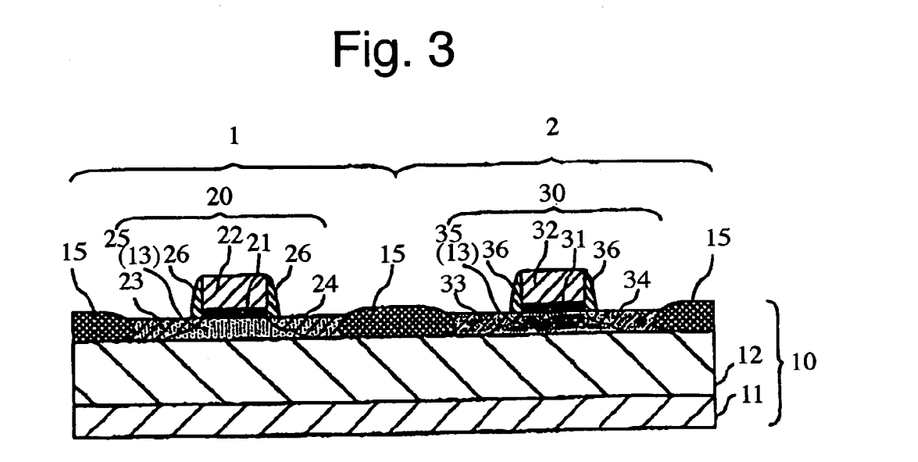
FIG. 3 is a cross-sectional view of a third step of the present invention.

FIG. 1 thorough FIG. 3 are a process-sectional views showing a process for manufacturing a semiconductor device of the present invention.

An SOI substrate 10 is provided as shown in FIG. 1. The SOI substrate 10 includes a silicon substrate 11, a buried oxide layer 12 and an SOI 13, formed in this order. The SOI layer 13 is made of single crystal silicon. A thickness ts of the SOI layer 13 is 28 nm through 42 nm. When the thickness of the SOI layer 13 ts is thicker than the predetermined thickness, the SOI layer 13 is etched so that the thickness of the SOI layer 13 is within a range from range 28 nm to 42 nm.

Impurity ions are introduced in the SOI layer 13 as shown in FIG. 1. The ions are introduced both of a FD-MOSFET forming area 1 for forming the FD-MOSFET and a PD-MOSFET forming area 2 for forming the PD-MOSFET.

As shown in FIG. 2, impurity ions are introduced in the PD-MOSFET forming area 2 selectively, while the silicon nitride film 14 is formed on the FD-MOSFET as a mask.

In order to introduce the ions in the SOI layer 13, the impurity concentration of the SOI layer 13 at the FD-MOSFET Df satisfies the following formulas.

$$Df \leq 9.29*10^{15}*(62.46-ts) \quad (1)$$

$$Df \leq 2.64*10^{15}*(128.35-ts) \quad (2)$$

Since the impurity concentration of the SOI layer 13 satisfies the formula (1), an N-type MOSFET formed in the SOI layer 13 operates as the fully-depleted MOSFET. Since the impurity concentration of the SOI layer 13 satisfies the formula (2), and when a drain voltage Vd is 1.5 V and a gate voltage Vg is 0 V, a standby current Ioff that flows from a drain to a source is $2.00*10^{-12}$ A/μm or more. That is, since the formula (2) is satisfied, a variation of a gate threshold voltage Vt at the FD-MOSFET forming area 1 is decreased. The standby current Ioff is defined by a current per a width of a channel region.

In order to introduce the ion in the SOI layer 13, the impurity concentration of the SOI layer 13 at the PD-MOSFET Dp satisfies the following formulas.

$$Dp \geq 9.29*10^{15}*(62.46-ts) \quad (3)$$

$$Dp \geq 2.64*10^{15}*(129.78-ts) \quad (4)$$

Since the impurity concentration of the SOI layer 13 satisfies the formula (3), an N-type MOSFET formed in the SOI layer 13 operates as the partially-depleted MOSFET. Since the impurity concentration of the SOI layer 13 satisfies the formula (4), and when a drain voltage Vd is 1.5 V and a gate voltage Vg is 0 V, a standby current Ioff that flows from a drain to a source is $2.00*10^{-12}$ A/μm or less. That is, since the formula (2) is satisfied, a variation of a gate threshold voltage Vt at the PD-MOSFET forming area 2 is decreased. The standby current Ioff is defined by a current per a width of a channel region.

As shown in FIG. 3, a field oxide layer 15 is formed between the FD-MOSFET forming area 1 and the PD-MOSFET forming area 2 by a LOCOS process. Then, the N-type MOSFET 20 is formed in the FD-MOSFET forming area 1 and the N-type MOSFET 30 is formed in the PD-MOSFET forming area respectively. The FD-MOSFET 20 includes a gate oxide layer 21, a gate electrode 22 formed on the gate oxide layer 21, a source region 23 having the N-type conductivity, a drain region 24 with the N-type conductivity and a sidewall structure 26 formed on the gate electrode 22. The PD-MOSFET 30 includes a gate oxide layer 31, a gate electrode 32 formed on the gate oxide layer 31, a source region 33 with the N-type conductivity, a drain region 34 with the N-type conductivity and a sidewall structure 36 formed on the gate electrode 32. A channel region 25 of the FD-MOSFET 20 is defined between the source region 23 and the drain region 24. A channel region 35 of the PD-MOSFET 30 is defined between the source region 33 and the drain region 34. The source regions 23, 33 and the drain regions 24, 34 are formed by introducing N-type ions.

In the present invention, both of the FD-MOSFET 20 and the PD-MOSFET 30 can be formed in the common SOI layer 13 while decreasing a variation of an electric characteristic of the MOSFET 20 and 30.

The impurity concentration Df of the SOI layer 13 at the FD-MOSFET forming area 1 can satisfy the following formula.

$$Df \leq 3.00*10^{15}*(102.67-ts) \quad (5)$$

Since the impurity concentration of the SOI layer 13 satisfies the formula (5), and when the drain voltage Vd is 1.5 V and the gate voltage Vg is 0 V, the standby current Ioff that flows from a drain to a source is $2.00*10^{-11}$ A/μm or more. That is, since the formula (5) is satisfied, a variation of a gate threshold voltage Vt at the FD-MOSFET forming area 1 is decreased. Since the standby current at formula (5) is larger than that of formula (2), the variation σ of the gate threshold voltage Vt of the N-type MOSFET that is applied the formula (5) is less than the variation σ of the gate threshold voltage Vt of the N-type MOSFET that is applied the formula (2).

Otherwise, the impurity concentration Dp of the SOI layer 13 at the PD-MOSFET forming area 2 can satisfy the following formula.

$$Dp \geq 3.29*10^{15}*(125.70-ts) \quad (6)$$

Since the impurity concentration of the SOI layer 13 satisfies the formula (6), and when the drain voltage Vd is 1.5 V and the gate voltage Vg is 0 V, the standby current Ioff that flows from a drain to a source is $2.00*10^{-13}$ A/μm or less. That is, since the formula (6) is satisfied, a variation of a gate threshold voltage Vt at the PD-MOSFET forming area 2 is decreased. Since the standby current at formula (6) is smaller than that of formula (4), the variation σ of the gate threshold voltage Vt of the N-type MOSFET satisfying the formula (6) is less than the variation σ of the gate threshold voltage Vt of the N-type MOSFET satisfying the formula (4).

A basis of the formulas (1) and (3) are shown as follows.

Figure 4:
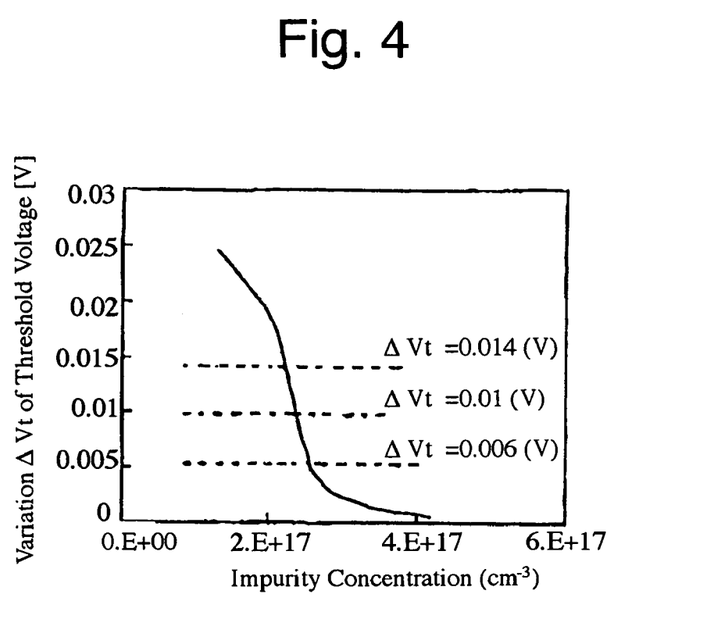
FIG. 4 is a plot showing a relationship between an impurity concentration of the SOI layer and a variation of the threshold voltage at a gate.

FIG. 4 shows a relationship between the impurity concentration Ds and a variation of a gate threshold voltage ΔVt, when the thickness of the SOI layer 13 is fixed. A plot shown in FIG. 4 is based on data of actual measurement and data of simulation.

Figure 5:
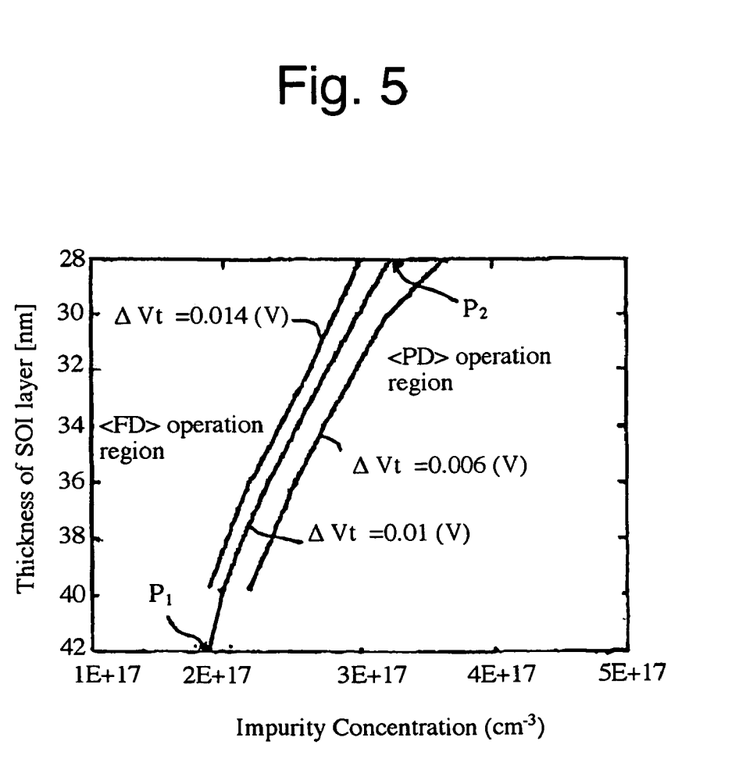
FIG. 5 is a plot showing a boundary between a fully-depleted operation area and a partially-depleted operation area according to an impurity concentration a thickness of an SOI layer.

A substrate voltage Vb is a voltage applied to the silicon substrate 11 of the SOI substrate 10. While the negative voltage, for example −2 V, is applied to the silicon substrate as the substrate voltage Vb, the gate threshold voltage Vt is increased. Generally, the variation σ of the gate threshold voltage ΔVt at the FD-MOSFET is large and the variation σ of the gate threshold voltage ΔVt at the PD-MOSFET is small. Therefore, at the point where the gate threshold voltage is varied immediately, it is determined that whether the MOSFET is operated as the FD-MOSFET or the PD-MOSFET. As shown in FIG. 4, it is assumed that a boundary between the FD operation area and PD operation area is a middle point of the variation range ΔVt=0.01 V where the gate threshold voltage ΔVt is varied immediately. That is, the MOSFET is operated as fully-depleted at ΔVt=0.014 V, and the MOSFET is operated as partially-depleted at ΔVt=0.006 V FIG. 5 shows a dependency of the boundary between the FD operation area and the PD operation area with the impurity concentration of the SOI layer 13 and the thickness of the SOI layer 13. A plot shown in FIG. 5 is based on data of actual measurement and data of simulation.

In FIG. 5, a left side of a curve line of ΔVt=0.01 V is the FD operation area and a right side of the curve line of ΔVt=0.01 V is the PD operation area. Since the curve line of ΔVt=0.01 V is approximately linear, a line passing through $P_1$ and $P_2$ is the boundary between the FD operation area and the PD operation area.

As shown in FIG. 5, $P^1$ is plotted at ts=42 nm and Ds=1.9*10$^{17}$ cm$^{-3}$. The $P_2$ is plotted at ts=28 nm and Ds=3.2*10$^{17}$ cm$^{-3}$. That is, the line passing through P1 and P2 is defined as follows.

$$ts=-((14/(1.3*10^{17}))Ds+62.46$$

Above equation can be changed as follows.

$$Ds=((1.3*10^{17})/14)*(62.46-ts)=9.29*10^{15}*(62.46-ts)$$

When the impurity concentration Df satisfies the following formula, the MOSFET is operated as an FD-MOSFET.

$$Df \leq 9.29*10^{15}*(62.46-ts) \quad (1)$$

When the impurity concentration Dp satisfies the following formula, the MOSFET is operated as a PD-MOSFET.

$$Dp \geq 9.29*10^{15}*(62.46-ts) \quad (3)$$

A basis of the formulas (2) and (4) are shown as follows.

Figure 6:
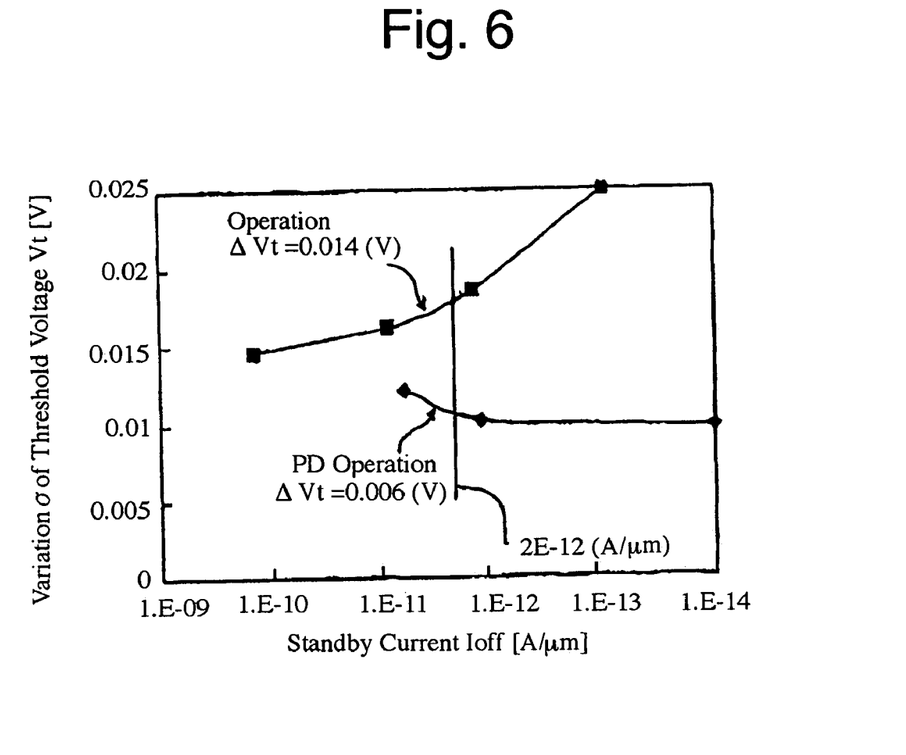
FIG. 6 is a plot showing a relationship between standby currents of FD-MOSFET and PD-MOSFET and a variation of a threshold voltage at a gate, when a drain voltage is 1.5 V.

FIG. 6 shows a relationship between the standby current Ioff of the FD-MOSFET and the PD-MOSFET and the variation σ of the gate threshold voltage Vt. A plot shown in FIG. 6 is based on data of actual measurement and a data of simulation.

In FIG. 6, a curve of ΔVt=0.014 V shows a characteristics of the FD-MOSFET. While a standby current Ioff is decreased, a variation of a gate threshold voltage is increased. The curve of ΔVt=0.014 V is increased immediately, when the standby current Ioff becomes lower than $2*10^{-12}$ A/μm. Therefore, the FD-MOSFET should be fabricated so that the standby current Ioff is higher than $2*10^{-12}$ A/μm.

In FIG. 6, a curve of ΔVt=0.006 V shows a characteristics of the PD-MOSFET. While a standby current Ioff is increased, a variation of a gate threshold voltage is increased. The curve of ΔVt=0.006 V is increased immediately, when the standby current Ioff becomes higher than $2*10^{-12}$ A/μm. Therefore, the PD-MOSFET should be fabricated so as to the standby current Ioff is lower than $2*10^{-12}$ A/μm.

Figure 7:
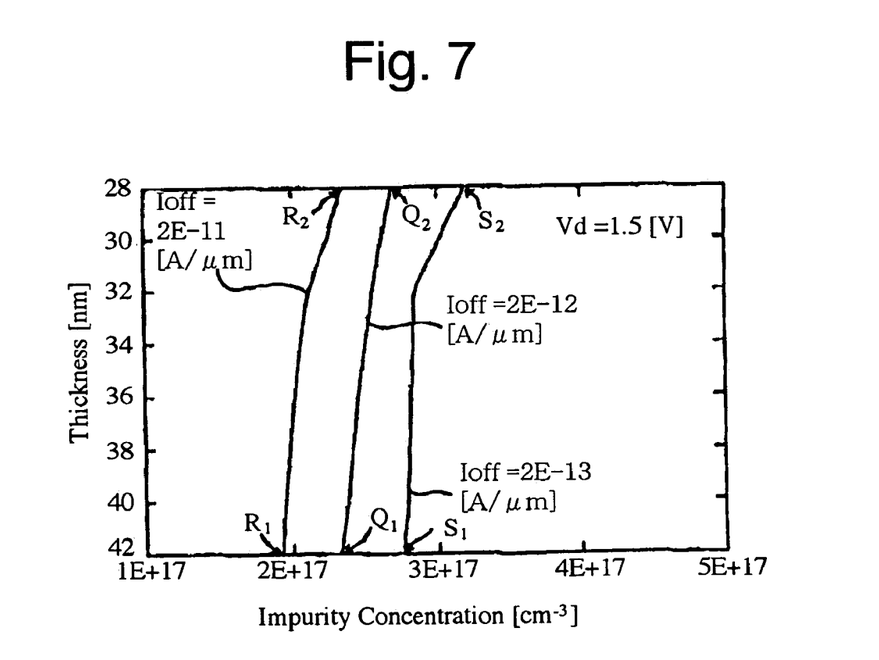
FIG. 7 is a plot showing a relationship between an impurity concentration and a thickness of an SOI layer, when a drain voltage is 1.5 V and standby currents are 2*10$^{-11}$ A/$\mu$m, 2*10$^{-12}$ A/$\mu$m and 2*10$^{-13}$ A/$\mu$m.

FIG. 7 shows an impurity concentration Ds of the SOI layer 13 and a thickness ts of the SOI layer 13 for setting a standby current Ioff to $2*10^{-11}$ A/μm, $2*10^{-12}$ A/μm and $2*10^{-13}$ A/μm, when a drain voltage Vd is 1.5 V Data relating the respective curve lines in FIG. 7 are shown in table 1.

TABLE 1

| | Impurity concentration Ds [cm$^{-3}$] | | |
|---|---|---|---|
| thickness ts [nm] | Vd[V] = 1.5, Ioff[A/μm] = 2 * 10$^{-11}$ | Vd[V] = 1.5, Ioff[A/μm] = 2 * 10$^{-12}$ | Vd[V] = 1.5, Ioff[A/μm] = 2 * 10$^{-13}$ |
| 28 | 2.35 * 10$^{17}$ | 2.69 * 10$^{17}$ | 3.21 * 10$^{17}$ |
| 32 | 2.12 * 10$^{17}$ | 2.55 * 10$^{17}$ | 2.84 * 10$^{17}$ |
| 33 | 2.09 * 10$^{17}$ | 2.52 * 10$^{17}$ | 2.83 * 10$^{17}$ |
| 37 | 2.00 * 10$^{17}$ | 2.13 * 10$^{17}$ | 2.81 * 10$^{17}$ |
| 38 | 1.99 * 10$^{17}$ | 2.41 * 10$^{17}$ | 2.80 * 10$^{17}$ |
| 40 | 1.95 * 10$^{17}$ | 2.37 * 10$^{17}$ | 2.78 * 10$^{17}$ |
| 42 | 1.93 * 10$^{17}$ | 2.32 * 10$^{17}$ | 2.75 * 10$^{17}$ |

Figure 8:
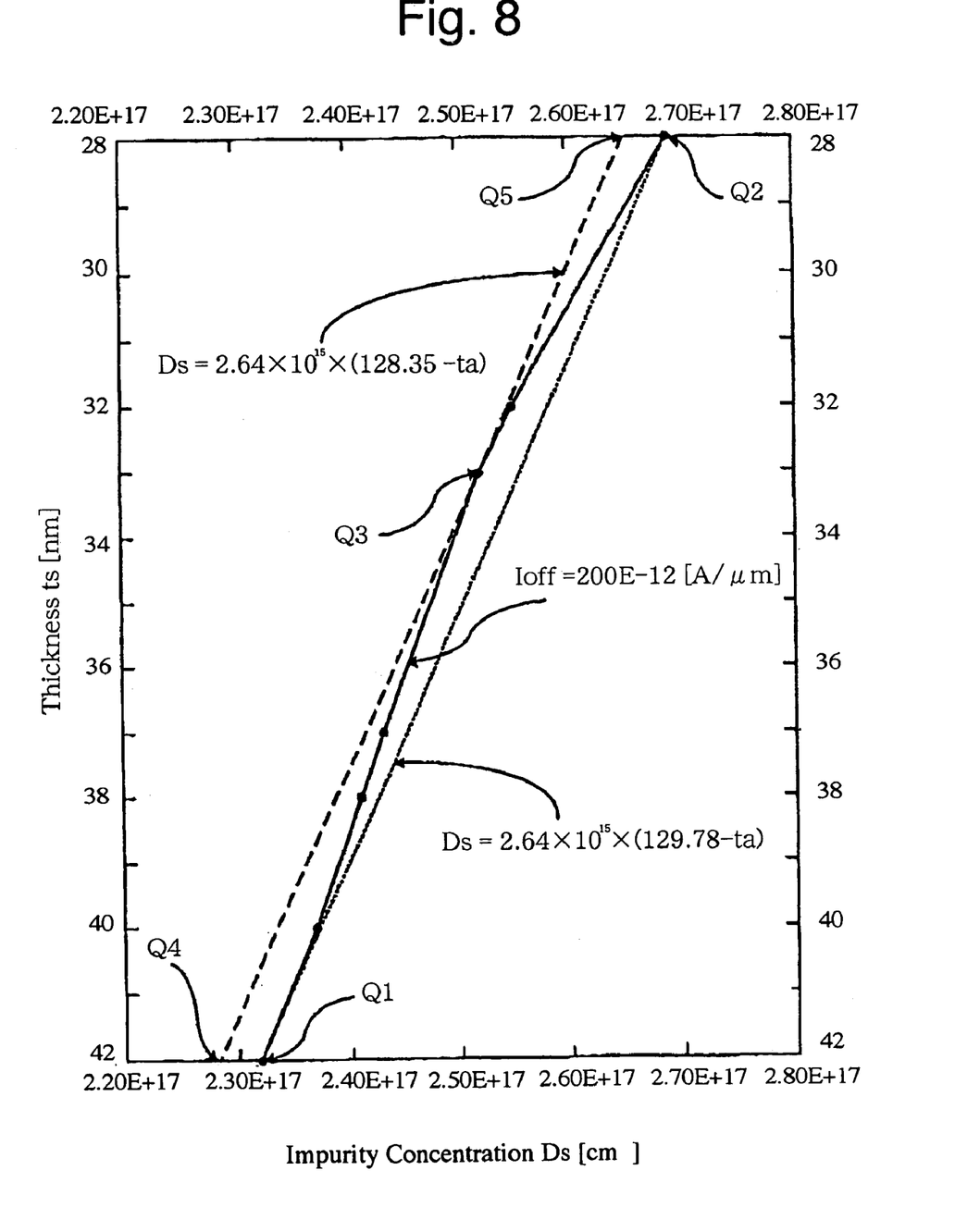
FIG. 8 is a plot showing an approximate line of a curve while a drain voltage is 1.5 V and a standby current is 2*10$^{-12}$ A/$\mu$m.

FIG. 8 shows an impurity concentration Ds of the SOI layer 13 and a thickness ts of the SOI layer 13 for setting a standby current Ioff to 2A/μm, $2*10^{-11}$ A/μm, $2*10^{-12}$ A/μm and $2*10^{-12}$ A/μm, when a drain voltage Vd is 1.5 V. In the FIG. 8, $Q_1$ is plotted at ts=42 nm and Ds=2.3*10$^{17}$ cm$^{-3}$. $Q_2$ is plotted at ts=28 nm and Ds=2.69*10$^{17}$ cm$^{-3}$. That is, the line passing through $Q_1$ and $Q_2$ is defined as follows.

$$ts=((14/(0.37*10^{17}))Ds+129.78$$

Above equation can be changed as follows.

$$Ds=(0.37*10^{17})/14)*(129.78-ts)=2.64*10^{15}*(129.78-ts)$$

A slope of a line passing through $Q_4$ and $Q_5$ is equal to that of the line passing through $Q_1$ and $Q_2$. $Q_3$ is plotted at ts=33 nm and Ds=2.52*10$^{17}$ cm$^{-3}$. That is, the line passing through $Q_4$ and $Q_5$ is defined as follows.

$$ts=-((14/(0.37*10^{17}))Ds+128.35$$

Above equation can be changed as follows.

$$Ds=(0.37*10^{17})/14)*(128.35-ts)=2.64*10^{15}*(128.35-ts)$$

When the impurity concentration Df of the SOI layer 13 satisfies a following formula (2), the standby current Ioff is $2.00*10^{-12}$ A/μm or more. Therefore, the variation σ of the gate threshold voltage Vt of the FD-MOSFET is decreased.

$$Df \leq 2.64*10^{15}*(128.35-ts) \quad (2)$$

When the impurity concentration Df of the SOI layer 13 satisfies a following formula (4), the standby current Ioff is $2.00*10^{-12}$ A/μm or less. Therefore, the variation σ of the gate threshold voltage Vt of the PD-MOSFET is decreased.

$$Dp \geq 2.64*10^{15}*(129.78-ts) \quad (4)$$

Figure 9:
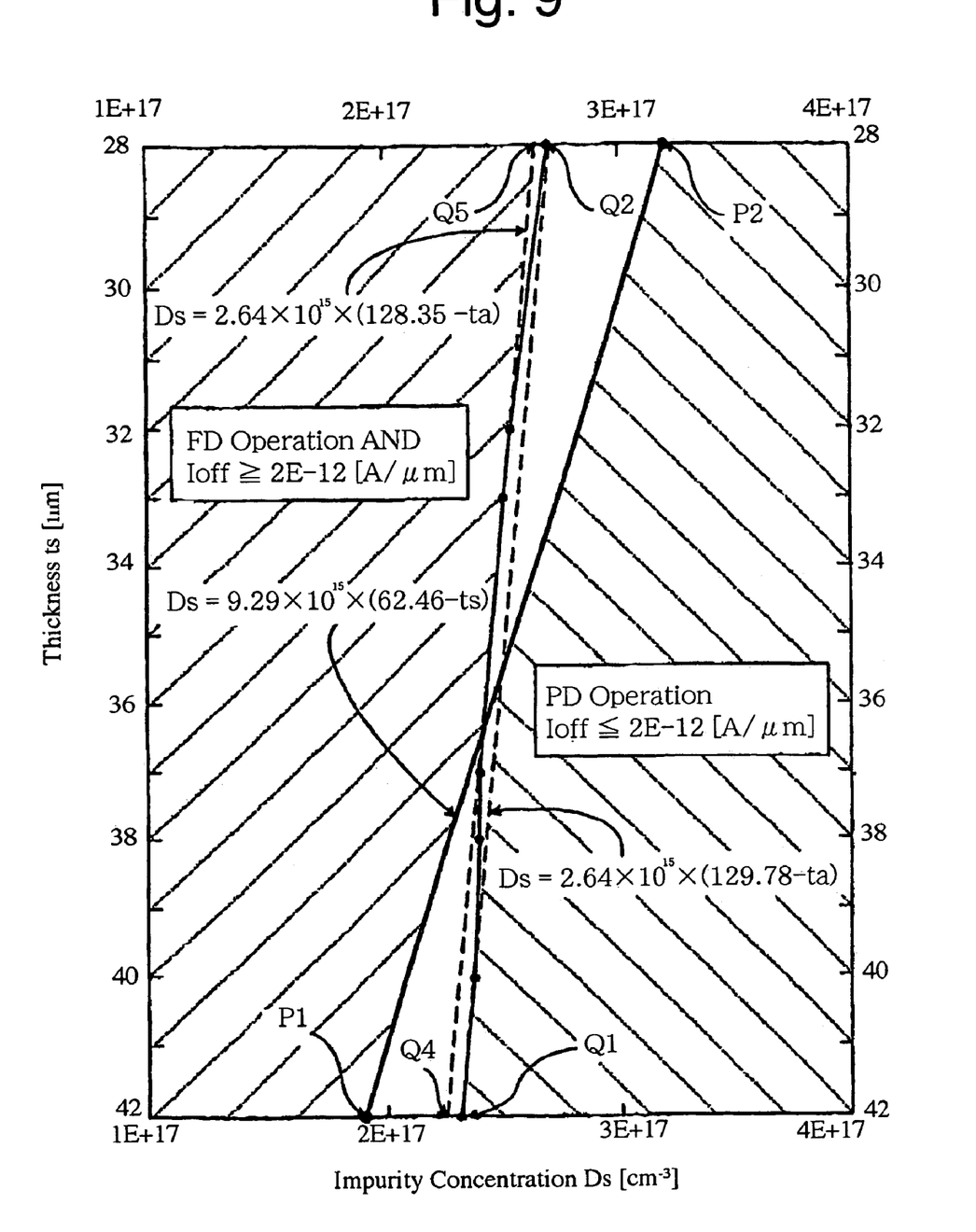
FIG. 9 is a plot showing an area that operated by fully-depleted and standby current is lower than 2*10$^{-12}$ A/$\mu$m.

FIG. 9 shows an area that satisfies the formulas (1) and (2) and an area that satisfies the formulas (3) and (4).

In FIG. 9, a left shaded portion shows an area that the MOSFET is operated as the FD-MOSFET and the standby current is $2.00*10^{-12}$ A/μm or more, and a right shaded shows an area that the MOSFET is operated as the PD-MOSFET and the standby current is $2.00*10^{-12}$ A/μm or less. The left shaded portion satisfies the formulas (1) and (2) of the FD-MOSFET, and the right shaded portion satisfies the formulas (3) and (4) of the PD-MOSFET.

A basis of the formula (5) is shown as follows.

Figure 10:
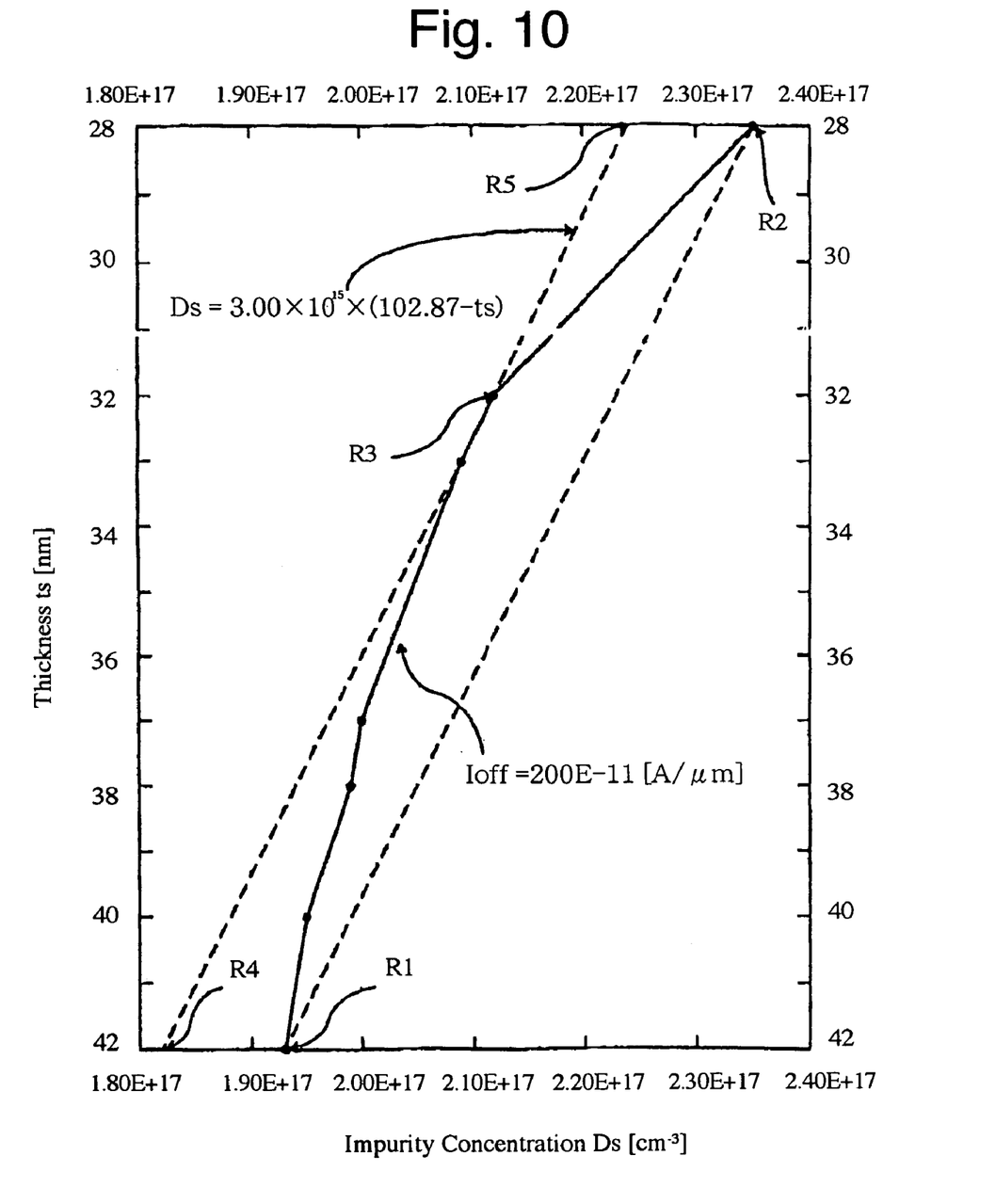
FIG. 10 is a plot showing a curve when a drain voltage is 1.5 V and standby current is 2*10$^{-11}$ A/$\mu$m and that of an approximate line.

FIG. 10 shows a curve that shows the impurity concentration Ds of the SOI layer 13 and the thickness ts of the SOI layer 13, when the drain voltage Vd is 1.5 V and the standby current Ioff is $2.00*10^{-11}$ A/μm. FIG. 10 also shows a line that is approximated with the curve.

In FIG. 10, $R^1$ is plotted at ts=42 nm and Ds=Ds=2.35*10$^{17}$ cm$^{-3}$. $R_2$ is plotted at ts=28 nm and Ds=2.35*10$^{17}$ cm$^{-3}$. That is, the line passing through $R_1$ and $R_2$ is defined as follows.

$$ts=-((14/(0.42*10^{17}))Ds+106.33$$

$R_3$ is plotted at ts=32 nm and Ds=2.12*10$^{17}$ cm$^{-3}$. Since a slope of a line passing through $R^4$ and $R^5$ is equal to a slope of the line passing through $R^1$ and $R^2$, the line passing through $R^4$ and $R^5$ is defined as following formula.

$$ts=-((14/(0.42*10^{17}))Ds+102.67$$

Above equation can be changed as follows.

$$Ds=((0.42*10^{17})/14)*(102.67-ts)=3.00*10^{15}*(102.67-ts)$$

When the impurity concentration Df of the SOI layer 13 satisfies a following formula (5), the standby current Ioff is $2.00*10^{-11}$ A/μm or more. Therefore, the variation σ of the gate threshold voltage Vt of the FD-MOSFET is decreased.

$$Df \leq 3.00*10^{15}*(102.67-ts) \quad (5)$$

A basis of the formula (6) is shown as follows.

Figure 11:
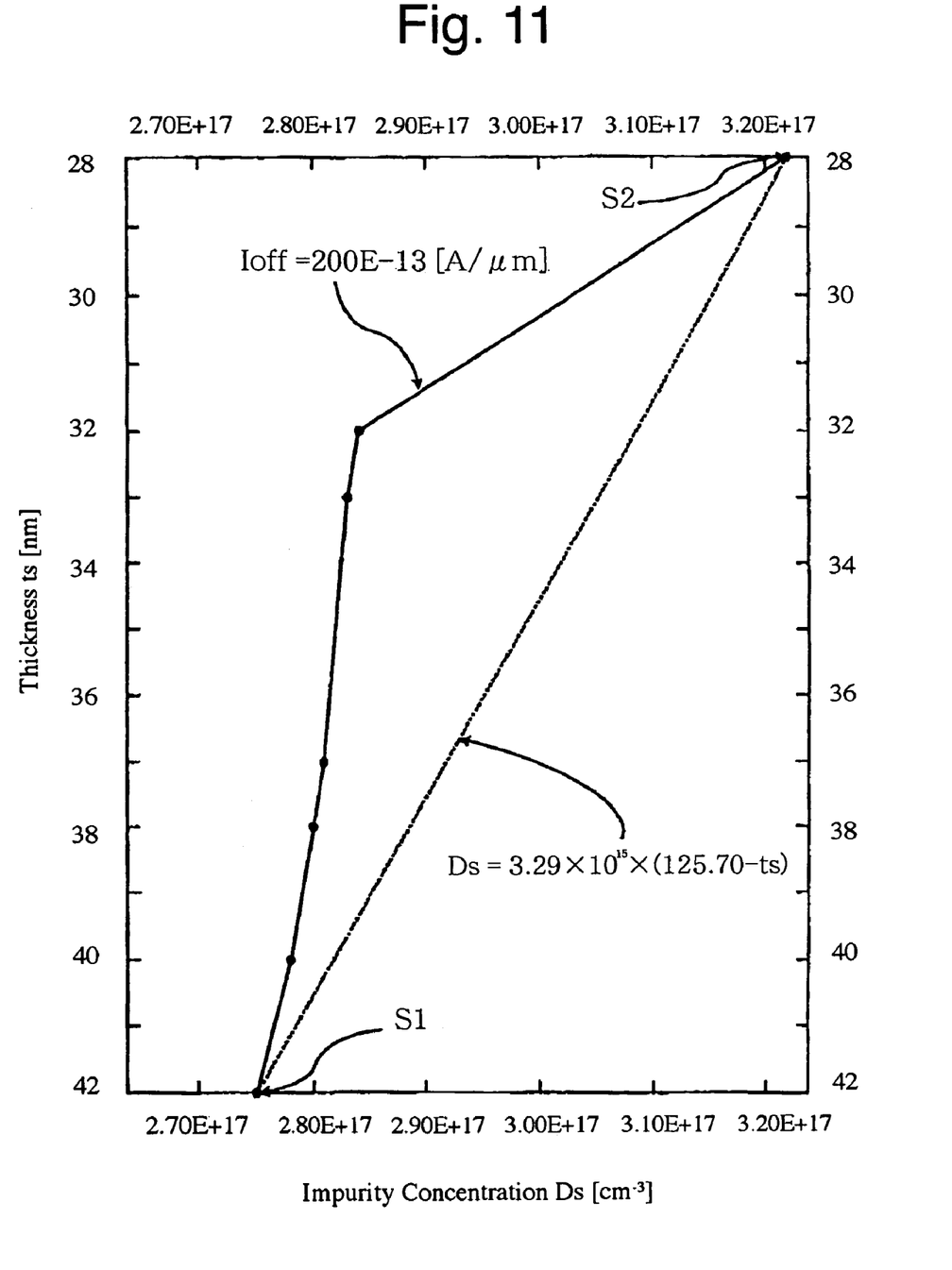
FIG. 11 is a plot showing a curve when a drain voltage is 1.5 V and standby current is 2*10$^{-13}$ A/$\mu$m and that of an approximate line.

FIG. 11 shows a curve that shows the impurity concentration Ds of the SOI layer 13 and the thickness ts of the SOI layer 13, when the drain voltage Vd is 1.5 V and the standby current Ioff is $2.00*10^{-13}$ A/μm. FIG. 11 also shows a line that is approximated with the curve.

In FIG. 11, $S_1$ is plotted at ts=42 nm and Ds=Ds=$2.75*10^{17}$ cm$^{-3}$. $S_2$ is plotted at ts=28 nm and Ds=$3.21*10^{17}$ cm$^{-3}$. That is, the line passing through $S_1$ and $S_2$ is defined as follows.

$$ts = -((14/(0.46*10^{17}))Ds + 125.70$$

Above equation can be changed as follows.

$$Ds = ((0.46*10^{17})/14)*(125.70-ts) = 3.29*10^{15}*(125.70-ts)$$

When the impurity concentration of the SOI layer 13 satisfies a following formula (6), the standby current Ioff is $2.00*10^{-13}$ A/μm or less. Therefore, the variation σ of the gate threshold voltage Vt of the PD-MOSFET is decreased.

$$Df \leq 3.29*10^{15}*(125.70-ts) \quad (5)$$

Figure 12:
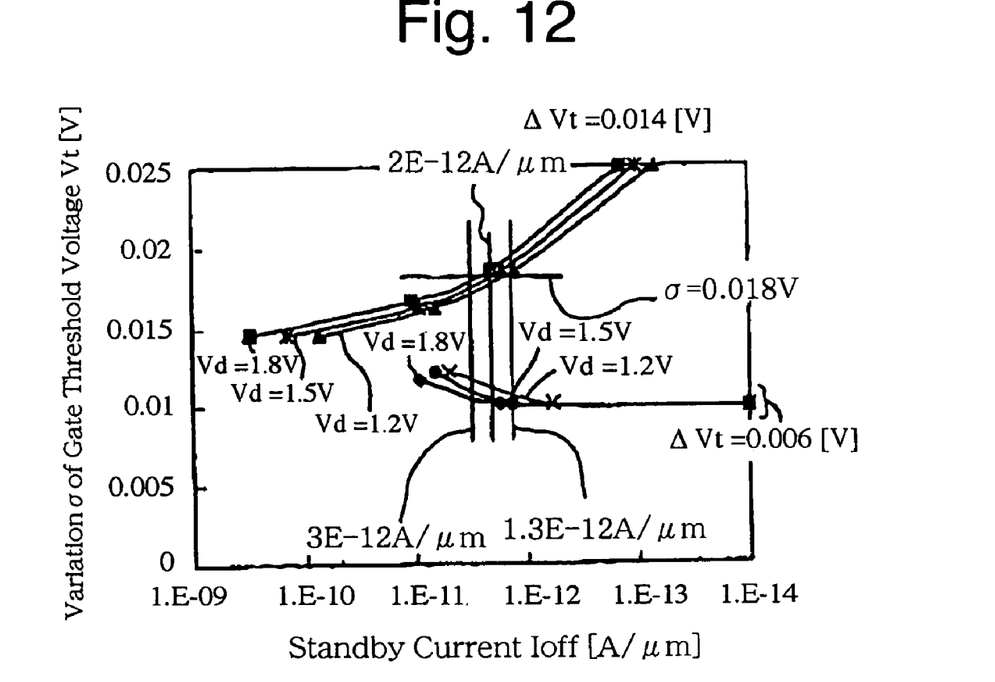
FIG. 12 is a plot showing between a standby currents of FD-MOSFET and PD-MOSFET and a variation of threshold voltage of a gate, when a drain voltage are 1.2 V, 1.5 V and 1.8 V.

FIG. 12 shows a relationship between the standby current Ioff and the variation σ of the gate threshold voltage Vt in the FD-MOSFET and the PD-MOSFET, when the drain voltage Vd is 1.2 V, 1.5 V or 1.8 V. A plot shown in FIG. 12 is based on data of actual measurement and data of simulation.

In FIG. 12, curves of ΔVt=0.014 V in which the drain voltage is 1.2 V, 1.5 V and 1.8 V shows a characteristic of the FD-MOSFET. In the curves, the variation σ of the gate threshold voltage Vt is increased, while the standby current Ioff is decreased.

The curve line shown in FIG. 12 is plotted under the condition of Vd=1.5 V and ΔVt =0.014 V, when the standby current Ioff is $2.00*10^{-12}$ A/μm, the variation σ of the gate threshold voltage Vt is 0.018 V, under the above condition.

The curve line shown in FIG. 12 is plotted under the condition of Vd=1.2 V and ΔVt=0.014 V, the variation σ is 0.018 V, when the standby current Ioff is approximately $1.3*10^{-12}$ A/μm. In the area that the standby current Ioff is less than $1.3*10^{-12}$ A/μm, a slope of the curve of Vd =1.2 V and ΔVt=0.014 V is increased immediately. Therefore, the FD-MOSFET that is applied the 1.2 V as the drain voltage Vd should be fabricated so as to the standby current Ioff is more than $1.3*10^{-12}$ A/μm.

The curve line shown in FIG. 12 is plotted under the condition of Vd=1.8 V and ΔVt=0.014 V, the variation σ is 0.018 V, when the standby current Ioff is approximately $3*10^{-12}$ A/μm. In the area that the standby current Ioff is less than $3*10^{12}$ A/μm, a slope of the curve of Vd=1.8 V and ΔVt=0.014 V is increased immediately. Therefore, the FD-MOSFET that is applied the 1.8 V as the drain voltage Vd should be fabricated so as to the standby current Ioff is more than $3*10^{-12}$ A/μm.

From curves showing ΔVt =0.006 V as shown in FIG. 12, the drain voltage is 1.2 V, 1.5 V and 1.8 V relates the PD-MOSFET. In the curves, the variation σ of the gate threshold voltage Vt is increased, while the standby current Ioff is increased. Therefore, the PD-MOSFET that is applied the 1.2 V as the drain voltage Vd should be fabricated so as to the standby current Ioff is less than $1.3*10^{12}$ A/μm. The PD-MOSFET that is applied the 1.8 V as the drain voltage Vd should be fabricated so as to the standby current Ioff is less than $3*10^{-12}$ A/μm.

Figure 13:
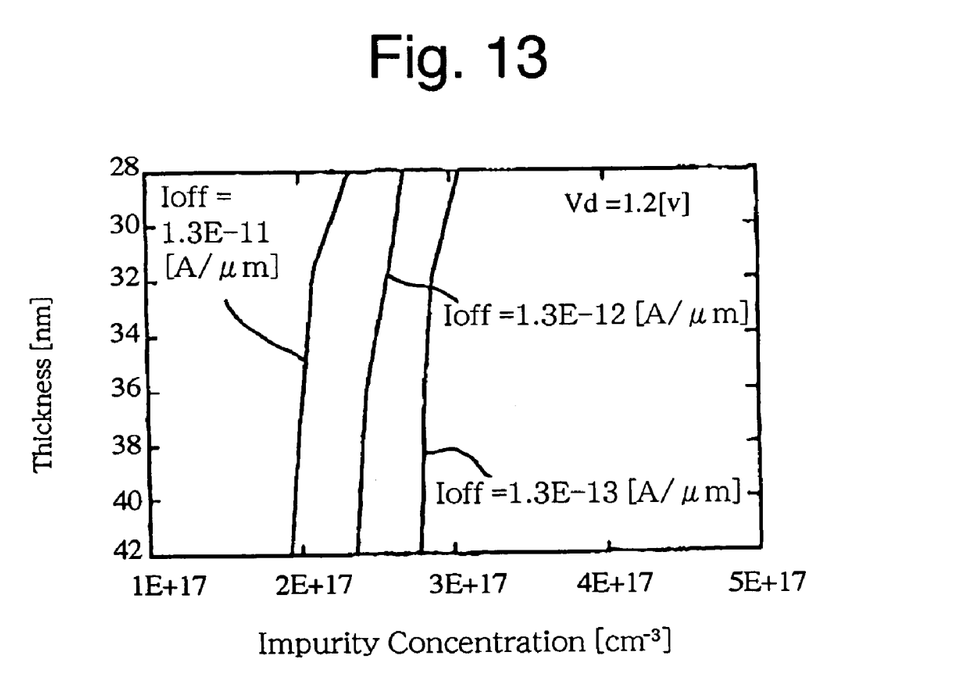
FIG. 13 is a plot showing a relationship between an impurity concentration of an SOI layer and a thickness of the SOI layer, when a drain voltage is 1.2 V and standby currents are 1.3*10$^{11}$ A/$\mu$m, 1.3*10$^{12}$ A/$\mu$m and 1.3*10$^{-13}$ A/$\mu$m.

FIG. 13 shows a impurity concentration Ds of the SOI layer 13 and a thickness ts of the SOI layer 13 for setting a standby current Ioff to $1.3*10^{-11}$ A/μm, $1.3*10^{-12}$ A/μm and $1.3*10^{-13}$ A/μm, when a drain voltage Vd is 1.2 V. A plot shown in FIG. 13 is based on a data of actual measurement and a data of simulation. The plot that the drain voltage Vd is 1.2 V has substantially same characteristic to the plot that the drain voltage Vd is 1.5 V.

Figure 14:
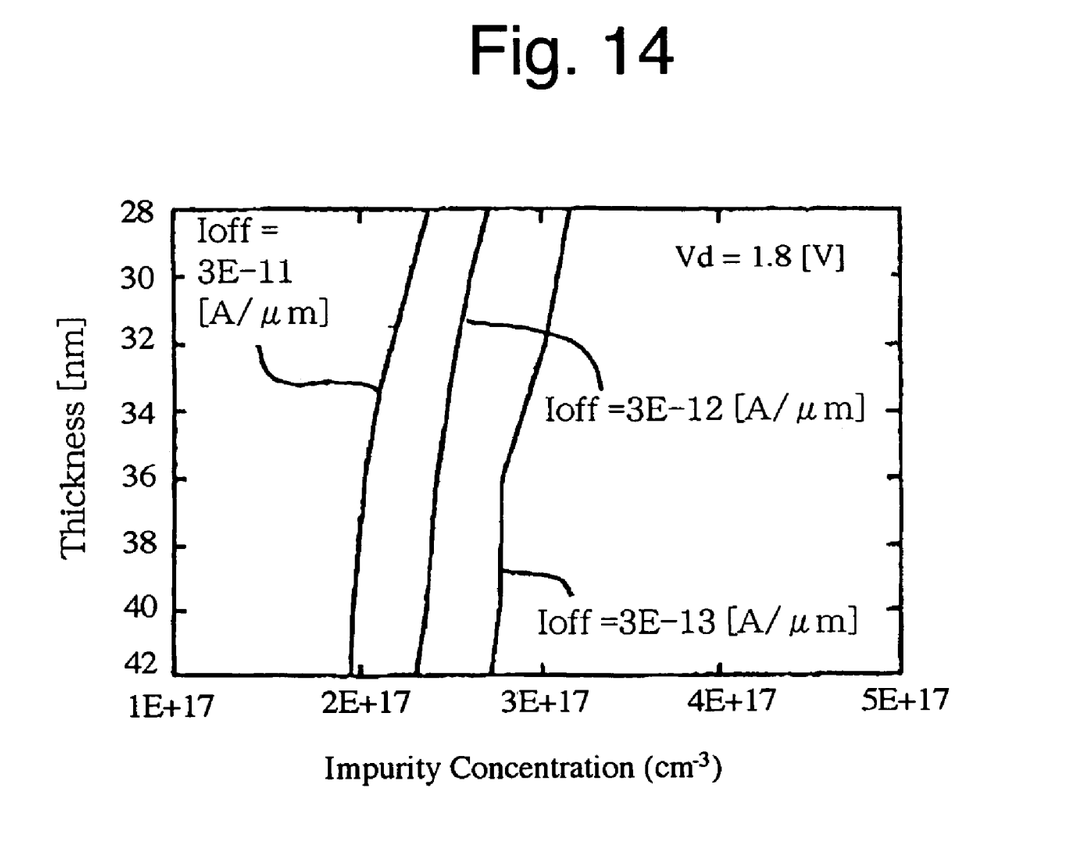
FIG. 14 is a plot showing a relationship between an impurity concentration of an SOI layer and a thickness of the SOI layer, when a drain voltage is 1.8 V and standby currents are 3*10$^{11}$ A/$\mu$m, 3*10$^{12}$ A/$\mu$m and 3*10$^{-13}$ A/$\mu$m.

FIG. 14 shows a impurity concentration Ds of the SOI layer 13 and a thickness ts of the SOI layer 13 for setting a standby current Ioff to $3*10^{-11}$ A/μm, $3*10^{-12}$ A/μm and $3*10^{-13}$ A/μm, when a drain voltage Vd is 1.8 V. A plot shown in FIG. 13 is based on a data of actual measurement and a data of simulation. The plot that the drain voltage Vd is 1.8 V has substantially same characteristic to the plot that the drain voltage Vd is 1.5 V. Therefore, when the drain voltage is varied, above formula (1) to (6) can be applied.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device comprising:
   a substrate having an insulating layer formed thereon;
   a silicon layer having a thickness ts formed on the insulating layer, the silicon layer including a first area having a first impurity concentration of Df cm$^{-3}$, and a second area having a second impurity concentration of Dp cm$^{-3}$;
   a fully-depleted MOSFET formed in the first area of the silicon layer; and
   a partially-depleted MOSFET formed in the second area of the silicon layer,
   wherein the semiconductor device satisfies the following conditions:

$$28 \text{ nm} \leq ts \leq 42 \text{ nm},$$

$$Df \leq 9.29*10^{15}*(62.46-ts),$$

$$Df \leq 2.64*10^{15}*(128.35-ts),$$

$$Dp \geq 9.29*10^{15}*(62.46-ts), \text{ and}$$

$$Dp \geq 2.64*10^{15}*(129.78-ts).$$

2. A semiconductor device according to claim 1, wherein the device satisfies a condition of $Df \leq 3.00*10^{15}*(102.67-ts)$.

3. A semiconductor device according to claim 1, wherein the device satisfies a condition of $Dp \geq 3.29*10^{15}*(125.70-ts)$.

4. A semiconductor device according to claim 1, wherein the thickness of the silicon layer has a range of 38 nm to 42 nm, the first impurity concentration Df is equal to or more than $1.9*10^{17}$ cm$^{-3}$, and the second impurity concentration Dp is equal to or less than $2.2*10^{17}$ cm$^{-3}$.

5. A semiconductor device according to claim 1, wherein the thickness of the silicon layer has a range of 33 nm to 37 nm, the first impurity concentration Df is equal to or less than $2.5*10^{17}$ cm$^{-3}$, and the second impurity concentration Dp is equal to or more than $2.7*10^{17}$ cm$^{-3}$.

6. A semiconductor device according to claim 1, wherein the thickness of the silicon layer has a range of 28 nm to 32 nm, the first impurity concentration Df is equal to or less than $2.7*10^{17}$ cm$^{-3}$, and the second impurity concentration Dp is equal to or more than $3.2*10^{17}$ cm$^{-3}$.

7. A semiconductor device comprising:
a silicon substrate;
a buried oxide layer formed on the silicon substrate;
an SOI layer formed on the buried oxide layer, the SOI layer having a thickness ts of about 28 nm to 42 nm, the SOI having a fully-depleted area having a first impurity concentration Df (cm$^{-3}$) and a partially-depleted area having a second impurity concentration Dp (cm$^{-3}$);
a first MOS transistor formed on the fully-depleted area of the SOI layer; and
a second MOS transistor formed on the partially-depleted area of the SOI layer,
wherein the first and second impurity concentrations satisfy the following conditions:

$Df \leq 9.29*10^{15}*(62.46-ts)$, $Df \leq 2.64*10^{15}*(128.35-ts)$, $Dp \geq 9.29*10^{15}*(62.46-ts)$, and $Dp \geq 2.64*10^{15}*(129.78-ts)$.

8. A semiconductor device according to claim 7, wherein the first impurity concentration satisfies a condition of $Df \leq 3.00*10^{15}*(102.67-ts)$.

9. A semiconductor device according to claim 7, wherein the second impurity concentration satisfies a condition of $Dp \geq 3.29*10^{15}*(125.70-ts)$.

10. A semiconductor device according to claim 7, wherein the thickness ts is about 38 nm to 42 nm, the first impurity concentration Df is equal to or more than $1.9*10^{17}$ cm$^{-3}$, and the second impurity concentration Dp is equal to or less than $2.2*10^{17}$ cm$^{-3}$.

11. A semiconductor device according to claim 7, wherein the thickness ts is about 33 nm to 37 nm, the first impurity concentration Df is equal to or more than $2.5*10^{17}$ cm$^{-3}$, and the second impurity concentration Dp is equal to or less than $2.7*10^{17}$ cm$^{-3}$.

12. A semiconductor device according to claim 7, wherein the thickness ts is about 28 nm to 32 nm, the first impurity concentration Df is equal to or more than $2.7*10^{17}$ cm$^{-3}$, and the second impurity concentration Dp is equal to or less than $3.2*10^{17}$ cm$^{-3}$.

13. A semiconductor device comprising:
a semiconductor substrate;
a buried oxide layer formed on the substrate;
a silicon layer formed on the buried oxide layer, the silicon layer having a thickness ts of about 28 nm to 42 nm, the silicon layer having a fully-depleted area having a first impurity concentration Df (cm$^{-3}$) and a partially-depleted area having a second impurity concentration Df (cm$^{-3}$);
a first source and a first drain formed on the fully-depleted area of the silicon layer;
a first gate insulating layer formed on the fully-depleted area of the silicon layer between the first source and the first drain;
a first gate electrode formed on the first gate insulating layer;
a second source and a second drain formed on the partially-depleted area of the silicon layer;
a second gate insulating layer formed on the partially-depleted area of the silicon layer between the second source and the second drain; and
a second gate electrode formed on the second gate insulating layer,
wherein the first and second impurity concentrations satisfy the following conditions:

$Df \leq 9.29*10^{15}*(62.46-ts)$, $Df \leq 2.64*10^{15}*(128.35-ts)$, $Dp \geq 9.29*10^{15}*(62.46-ts)$, and $Dp \geq 2.64*10^{15}*(129.78-ts)$.

14. A semiconductor device according to claim 13, wherein the first impurity concentration satisfies a condition of $Df \leq 3.00*10^{15}*(102.67-ts)$.

15. A semiconductor device according to claim 13, wherein the second impurity concentration satisfies a condition of $Dp \geq 3.29*10^{15}*(125.70-ts)$.

16. A semiconductor device according to claim 13, wherein the thickness ts is about 38 nm to 42 nm, the first impurity concentration Df is equal to or more than $1.9*10^{17}$ cm$^{-3}$, and the second impurity concentration Dp is equal to or less than $2.2*10^{17}$ cm$^{-3}$.

17. A semiconductor device according to claim 13, wherein the thickness ts is about 33 nm to 37 nm, the first impurity concentration Df is equal to or more than $2.5*10^{17}$ cm$^{-3}$, and the second impurity concentration Dp is equal to or less than $2.7*10^{17}$ cm$^{-3}$.

18. A semiconductor device according to claim 13, wherein the thickness ts is about 28 nm to 32 nm, the first impurity concentration Df is equal to or more than $2.7*10^{17}$ cm$^{-3}$, and the second impurity concentration Dp is equal to or less than $3.2*10^{17}$ cm$^{-3}$.

* * * * *